US010301184B2

(12) United States Patent
Machoke et al.

(10) Patent No.: US 10,301,184 B2
(45) Date of Patent: May 28, 2019

(54) ZEOLITIC MATERIALS HAVING A DISTINCTIVE SINGLE CRYSTAL MACROPOROSITY AND METHOD FOR THE PRODUCTION THEREOF

(71) Applicants: Friedrich-Alexander-Universität Erlangen-Nürnberg, Erlangen (DE); Technische Universität Clausthal, Clausthal-Zellerfeld (DE)

(72) Inventors: Albert Gonche Fortunatus Machoke, Erlangen (DE); Alexandra Inayat, Erlangen (DE); Wilhelm Schwieger, Spardorf (DE); Ana Maria Beltrán Custodio, Nürnberg (DE); Erdmann Spiecker, Neunkirchen am Brandt (DE); Robert Güttel, Goslar (DE); Nadine Kruse, Clausthal-Zellerfeld (DE)

(73) Assignees: Friedrich-Alexander-Universität Erlangen-Nürnberg, Erlangen (DE); Technische Universität Clausthal, Clausthal-Zellerfeld (DE)

( * ) Notice: Subject to any disclaimer, the term of this patent is extended or adjusted under 35 U.S.C. 154(b) by 0 days.

(21) Appl. No.: 15/505,870

(22) PCT Filed: Aug. 21, 2015

(86) PCT No.: PCT/EP2015/069254
§ 371 (c)(1),
(2) Date: Feb. 22, 2017

(87) PCT Pub. No.: WO2016/026960
PCT Pub. Date: Feb. 25, 2016

(65) Prior Publication Data
US 2017/0267537 A1  Sep. 21, 2017

(30) Foreign Application Priority Data

Aug. 22, 2014  (DE) .................. 10 2014 012 681

(51) Int. Cl.
| *C01B 39/40* | (2006.01) |
| *C01B 39/48* | (2006.01) |
| *B01J 29/40* | (2006.01) |
| *B01J 20/18* | (2006.01) |
| *C01B 37/02* | (2006.01) |

(Continued)

(52) U.S. Cl.
CPC .............. *C01B 39/48* (2013.01); *B01J 20/18* (2013.01); *B01J 29/40* (2013.01); *C01B 37/02* (2013.01);

(Continued)

(58) Field of Classification Search
CPC ......... C01B 37/02; C01B 39/40; C01B 39/48; C01B 2006/16; C01B 2006/17;

(Continued)

(56) References Cited

FOREIGN PATENT DOCUMENTS

| EP | 1394113 | 8/2003 | |
| EP | 3183213 A1 * | 6/2017 | ............ C01B 37/02 |

OTHER PUBLICATIONS

Li et al, "Synthesis of hierarchial MFI zeolite microspheres with stacking nanocrystals", Microporous and Macroporous Materails (2009) pp. 104-110.*

(Continued)

*Primary Examiner* — David M Brunsman
(74) *Attorney, Agent, or Firm* — Parker Highlander PLLC

(57) ABSTRACT

The invention relates to a zeolitic material comprising zeolitic monocrystals, each of which has a pore system encompassing at least one micropore system and at least one macropore system, and to a method for producing a zeolitic material of said type. In said method, porous oxide particles are converted into the zeolitic material in the presence of an organic template and steam.

11 Claims, 11 Drawing Sheets

(51) Int. Cl.
  *C01B 39/04* (2006.01)
  *C01B 39/08* (2006.01)
  *C01B 39/12* (2006.01)
  *C01B 39/54* (2006.01)
  *C30B 7/10* (2006.01)
  *C30B 29/34* (2006.01)

(52) U.S. Cl.
  CPC ............ *C01B 39/04* (2013.01); *C01B 39/085* (2013.01); *C01B 39/12* (2013.01); *C01B 39/40* (2013.01); *C01B 39/54* (2013.01); *C30B 7/10* (2013.01); *C30B 29/34* (2013.01); *C01P 2004/61* (2013.01); *C01P 2004/62* (2013.01); *C01P 2004/64* (2013.01); *C01P 2006/16* (2013.01); *C01P 2006/17* (2013.01)

(58) Field of Classification Search
  CPC .............. C01P 2002/60; C01P 2004/61; C01P 2004/64; B01L 20/18; B01L 20/103; B01L 29/40
  See application file for complete search history.

(56) References Cited

OTHER PUBLICATIONS

Egeblad et al., "Templating Mesoporous Zeolites," *Chem. Mater.*, 20:946-960, 2008.

International Preliminary Report on Patentability issued in corresponding PCT Application No. PCT/EP2015/069254 dated Nov. 11, 2016. (Original document and English translation).

International Search Report and Written Opinion issued in corresponding PCT Application No. PCT/EP2015/069254, dated Dec. 18, 2015.

Möller et al., "One-step Synthesis of Hierarchical Zeolite Beta via Network Formation of Uniform Nanocrystals," *J. Am. Chem. Soc.*, 133:5284-5295, 2011.

Nakanishi, "Pore Structure Control of Silica Gels Based on Phase Seperation," *J. Porous Mat.*, 4:67-112, 1997.

Novelty Search Report provided by Swedish Patent and Registration Office, requested by applicant regarding the priority application, conducted on Jun. 23-24, 2015.

Search Report issued in corresponding German Application No. 10 2014 012 681.1, dated Mar. 19, 2015.

Serrano et al., "Synthesis strategies in the search for hierarchical zeolites," *Chem. Soc. Rev.*, 42:4004, 2013.

Tamon et al., "Synthesis of Zeolite Monolith with Hierarchical Micro/macropores by Ice-Templating and Steam-assisted Crystallization," *Chem. Eng. Trans.*, 32:2059-2064, 2013.

Yue et al., "Directly transforming as-synthesized MCM-41 to mesoporous MFI zeolite," *J. Mat. Chem.*, 18(17): 2044-2050, 2008.

Zhu et al., "Nanosized $CaCO_3$ as Hard Template for Creation of Intracrystal Pores within Silicalite-1 Crystal +," *Chem. Mat.*, 20(3):1134-1139, 2007.

* cited by examiner

ZEOLITIC MATERIALS HAVING A DISTINCTIVE SINGLE CRYSTAL MACROPOROSITY AND METHOD FOR THE PRODUCTION THEREOF

This application is a national phase application under 35 U.S.C. § 371 of International Application No. PCT/EP2015/069254, filed Aug. 21, 2015, which claims benefit of German Application No. 102014012681.1, filed Aug. 22, 2014, the entire contents of each of which are hereby incorporated by reference.

The present invention is directed to hierarchical zeolitic materials with intracrystalline macropores and micropores, as well as to methods for the production thereof.

Zeolites or zeolite-type materials ("zeo-types") are among the most important catalytic materials in petroleum processing and the petrochemical industry [Marcilly et al. Oil & Gas Science and Technology, 56 (2001) 499; Primo et al., Chem. Soc. Rev. (2014) DOI: 10.1039/C3CS60394F]. The broad application of zeolites as catalysts in the production of a variety of products is due to their adjustable acidity and perfectly structured micropores [Martinez et al. Coordination Chemistry Reviews, 255 (2011) 1580]. The presence of micropores with diameters in the magnitude of molecules leads to excellent shape selectivity in various processes catalyzed by zeolites [Martinez et al. Coordination Chemistry Reviews, 255 (2011) 1580]. However, those small pores also pose some challenges. They include (i) slow transport of different chemical species to and from the active centers, (ii) acceleration of the catalyst deactivation due to coking, and (iii) limitation of the catalytic reactions via zeolites to small molecules [Chen et al. J. Mater. Chem., 22 (2012) 17381; Li et al. ChemCatChem, 6 (2014) 46].

Various strategies have been developed to improve the performance and lifetime of the zeolites in different reactions [Serrano et al., Chem. Soc. Rev., 42 (2013) 4004]. These strategies are either based on the reduction of the size of the individual zeolite crystals or the production of hierarchical zeolites [Chen et al. J. Mater. Chem., 22 (2012) 17381, Serrano et al., Chem. Soc. Rev., 42 (2013) 4004]. The practical application of the first strategy is complicated by the difficult recovery of the nano crystals after the hydrothermal synthesis [Hartmann et al., Angew. Chem. 116 (2004) 6004]. The second strategy which deals with the preparation of hierarchical zeolites has attracted considerable attention from both the industrial sector and researchers. Hierarchical zeolites differ from conventional (purely microporous) zeolites in a more efficient material transport and resulting increased catalyst lifetimes in many reactions [Li et al. ChemCatChem, 6 (2014) 46]. Zeolites with hierarchical pore structure exhibit more than one level of porosity. According to IUPAC, there are three different levels of porosity; they include micropores (pore diameter $d_P$ up to <2 nm), mesopores ($d_P$ 2 to 50 nm) and macropores ($d_P$ more than 50 nm) [Haber et al. IUPAC, Pure and Appl. Chem., 63 (1991) 1227]. Hierarchical zeolites can comprise either micropores and mesopores, or micropores and macropores, or all three porosity levels [Chen et al. J. Mater. Chem., 22 (2012) 17381] with the decisive criterium for the hierarchy being the the crosslinking between the porosity levels that are present.

In the last few years, there were reports on several hierarchical zeolites in the literature [Serrano et al., Chem. Soc. Rev., 42 (2013) 4004; Lopez-Orozco et al., Adv. Mater., 23 (2011) 2602; Chen et al. J. Mater. Chem., 22 (2012) 17381; Li et al. ChemCatChem, 6 (2014) 46]. Most of these materials comprise combinations of micropores and mesopores and only a few additionally comprise macropores. This slow development of zeolites with micropores and macropores has nothing to do with these materials playing a minor part. It is very well known that zeolites with macropores exhibit better diffusion and material exchange properties which is extremely important for a number of applications such as catalytic processes, adsorption, separation and purification processes. Moreover, it is assumed that macropores can reduce the coke deposit and thus increase the lifetime of the catalyst [Chen et al., J. Mater. Chem., 22 (2012) 17381]. According to Chen et al., the methods for the production of zeolites with macropores which are based on the use of "hard templates" are very common. In this these methods, carbon, polymers, colloidal particles, monoliths or metallic compounds such as $CaCO_3$ are used as solid templates for the formation of macropores [Dong et al., Adv. Mater. 14 (2002) 1506; Zhao et al., Catal Lett 136 (2010) 266; Zhu et al., Chem. Mater., 20 (2008) 1134; Chen et al. J. Mater. Chem., 22 (2012) 17381]. Zeolites obtained in the presence of these templates typically have a 3D monolithic structure. Although the hard template method has been extensively researched and frequently applied, its used is limited and controversial for several reasons. These reasons include (i) the multi-step synthesis processes, (ii) the use of seeds which have to be prepared separately, (iii) the poor thermal stability of polymers under synthesis conditions, (iv) the formation of cracks in colloidal crystals, (v) harsh conditions for removing the template, and (vi) too long a duration for the formation of the 3D structure and its infiltration.

Tamon et al., Chemical Engineering Transactions, Vol. 32, 2013, 2059 and EP 1394113 A2 describe polycrystalline zeolite materials comprising micro- and macropores.

According to Zhu et al., nanoparticles of $CaCO_3$ were used as the template for the formation of a silicalite-1 material [Zhu et al., Chem. Mater., 20 (2008) 1134] which comprises pores with a broad size distribution from about 10 to 100 nm. The particles of the resulting material do not exhibit clear crystal boundaries but an aggregation structure of many individual crystals. This process as well has the disadvantage that the nanoparticles of $CaCO_3$ first had to be dispersed before they could be used for the hydrothermal zeolite synthesis. Furthermore, the silicalite-1 material had to be treated with acids after hydrothermal synthesis in order to remove the template. Moreover, the composition of these materials is limited to silicate.

Another approach to produce zeolites with macropores is the use of mesoporous silica particles which have been pretreated with zeolite seeds. These pretreated silica particles also serve as the template for the formation of hollow zeolite particles in the subsequent vapor phase conversion [Dong et al., Chem. Mater., 14 (2002) 3217]. The most significant advantage of this method is that no harsh follow-up treatments are necessary to remove the macropore template from the synthesis product. However, this method still requires a multi-step synthesis process. Furthermore, hollow zeolite particles are obtained which consist of individual spherical particles. These particles consist of a single, macroporous hollow space enveloped by a thin polycrystalline zeolite layer. While such structures are advantageous for binding guest molecules, due to their limited mechanical stability and their polycrystallinity, they are very ill-suited for, e.g., the use in catalyst beds.

Against this background, it was an object of the present invention to provide a macroporous zeolitic material whose production and use overcome the obstacles mentioned above.

Another object of the present invention was to provide a simplified method which leads to such zeolitic materials with distinctive macroporosity in the single crystals.

In order to solve this problem, the present invention provides a zeolitic material with distinctive macroporosity in the single crystals and having microporous walls of highly crystalline zeolite which envelop the macropores. The hierarchical pore system in the material according to the present invention offers excellent diffusion properties and strong resistance against coke formation in various catalytic reactions. Therefore, the macroporous zeolites according to the present invention are e.g. suitable as catalysts in the processing of petroleum, in the transformation of hydrocarbons, for example in redox reactions, rearrangements and condensation reactions. Additionally, the materials according to the present invention can be used in separation technology, the production of membranes and composite materials, as well as supports for the immobilization of various macromolecules (e.g. enzymes, dyes).

Furthermore, a method for the production of zeolitic materials with distinctive macroporosity in the single crystals is provided. The method according to the present invention can be carried out easily and quickly so that zeolitic single crystals with intracrystalline macropores can be obtained directly—i.e. without a seed preparation step before or after the process, without a charge reversal of the oxide particles used as starting material, without coating the oxide particles used as starting material with seeds, without a preparation of the macropore template, without dispersing the template for the formation of macropores, without the formation of 3D structures and without the removal of the template to expose the macropores.

The zeolitic material according to the present invention comprises zeolitic single crystals, which each have an intracrystalline pore system comprising at least one micropore system and at least one macropore system, wherein within each single crystal several macropores are present within a microporous zeolitic framework, and at least one system of interconnected macropores is present which comprises one or more openings to the crystal surface.

The framework of zeolites or zeolitic materials is formed by tetrahedral building units which are linked via their corners. In these tetrahedral building units, an atom T is surrounded by four oxygen atoms so that the basic units are also described with the formula $TO_2$ or $TO_{4/2}$. In this context, T denotes an element which is capable of forming an oxidic network and which can be present in tetrahedral coordination (hereinafter also referred to as "network-forming element"). Typical network-forming elements whose oxides are suitable for providing zeolite structures are elements of the main groups 3, 4 and 5 of the periodic table of the elements (groups 13, 14 and 15 according to current IUPAC classification). Examples include one or more elements selected from Si, Al, P, B, Ti, or Ga. When trivalent elements T appear in the framework in the form of linked tetrahedrons $TO_2$, such as Al, B, or Ti, they carry a negative formal charge. This charge is usually balanced by the presence of cations, whereby one type of cation or different cations can be used.

Preferably, the microporous zeolitic framework consists of tetrahedral $SiO_2$ units, wherein silicon atoms in the framework can be replaced with one or more other network-forming elements selected from elements of the third, fourth or fifth group of the periodic table of the elements. Preferably, the other network-forming elements are one or more elements selected from boron, aluminum, phosphorus and titanium. More preferred, the zeolitic framework is formed from tetrahedral $SiO_2$ units, wherein silicon atoms in the framework can be replaced with aluminum, or it consists exclusively of $SiO_2$ units. Typically, no more than 30%, preferably no more than 20% and more preferred no more than 10% of all silicon atoms in the zeolitic framework are replaced with other elements. In this connection, the percentage refers to the number of all network-forming atoms and thus all tetrahedrally coordinated positions in the zeolitic framework as 100%.

The cations for charge balancing of formal charges potentially present in the framework are preferably selected from alkali, alkaline earth or ammonium cations. A characteristic feature of zeolites or a zeolitic material is the mobility or interchangeability of the cations.

As was mentioned above, the microporous zeolitic framework in the zeolitic material of the present invention is preferably formed by linked $SiO_2$ (or $SiO_{4/2}$) tetrahedrons or $SiO_2$ and $AlO_2$ (or $SiO_{4/2}$ and $AlO_{4/2}$) tetrahedrons. Even though a certain number of the Si atoms can be replaced with other tetravalent atoms, and/or a certain number of the Al atoms can be replaced with other trivalent atoms, it is more preferred that the framework consist of $SiO_2$ and $AlO_2$ tetrahedrons, or only of $SiO_2$ tetrahedrons. The structure of such a zeolite framework can be expressed with the formula $M_{x/n}[(AlO_2)_x(SiO_2)_y]$ or $M_{x/n}[(AlO_2)_x(SiO_2)_y] \cdot z\, H_2O$. In the formula, M represents one or more types of cations with the valence or charge n (e.g. alkali and/or alkaline earth cations, so that n is typically 1 or 2, and in the presence of alkali and alkaline earth cations, it can also assume values between 1 and 2), and $H_2O$ represents the amount of water which can be adsorbed in the pores of the zeolite framework. The variables x and y represent the amount of neutral $SiO_2$ tetrahedrons and the negatively charged $AlO_2$ tetrahedrons, respectively. Preferably, the zeolitic material according to the present invention is a highly siliceous zeolitic material, and x can also be 0. The molar ratio Si/Al (and in particular the ratio y/x in the above formula) in such a highly siliceous material is preferably at least 3.5, more preferred at least 10, and especially preferred at least 15.

Generally, the preferred highly siliceous zeolitic materials are characterized in that the molar ratio of the tetrahedrally coordinated Si atoms to the sum of the other optionally present tetrahedrally coordinated network-forming atoms, such as boron, aluminum, phosphorus or titanium, in the zeolitic framework is at least 3.5, more preferred at least 10, and especially preferred at least 15.

As the person skilled in the art is well aware, depending on the selection of the components of the framework and the synthesis conditions, zeolites form characteristic microporous frameworks for which certain type designations have been established. Examples of types of zeolites which can form the framework of the zeolitic material according to the present invention include, as was mentioned above, in particular the so-called highly siliceous zeolites. Preferred types of zeolites which belong to this class of zeolites and can be provided according to the present invention are, in particular, those of the MFI, BEA, MOR, FER, MWW, MTW, DDR, CHA, AEI or MEL structure type. MFI and BEA type zeolites are especially preferred.

The zeolitic material according to the present invention comprises a microporous framework which corresponds to the known framework of zeolites as described above. Since the material according to the present invention also comprises macropores in addition to micropores within the microporous framework, the term "zeolitic material" is used in the present invention to illustrate this difference in comparison with conventional zeolite structures. As is characteristic of zeolitic structures, the micropores of the framework form at least one pore system of interconnected micropores.

The zeolitic material according to the present invention comprises zeolitic single crystals which can typically be easily identified as individual, particulate units under a microscope (e.g. an electron microscope) due to their crystal geometry (cf. FIG. 8). It is not excluded that, in addition to the single crystals, crystal types such as twin crystals, or intergrown crystals resulting from crystals connecting with each other during crystal growth, are present as well. They also exhibit the intracrystalline pore system with at least one micropore and one macropore system, as described above.

Unless otherwise noted in particular cases, the reference to micropores and macropores is based on the IUPAC convention wherein pores with a pore diameter $d_P$ of up to <2 nm are designated as micropores, pores with a diameter $d_P$ of 2 to 50 nm are designated as mesopores, and pores with a diameter of more than 50 nm are designated as macropores [Haber et al. IUPAC, Pure and Appl. Chem., 63 (1991) 1227]. For all sizes, the pore diameters can for example be determined by means of imaging techniques, e.g. electron micrographs, or by means of electron beam tomography. The latter is also suitable for determining pore diameters on the inside of crystals. In addition, sorption processes using gases (in particular for the diameters of micro or mesopores) or penetration methods using mercury (in particular for the diameters of the macropores) can be used. In the context of the present invention, the parameters of the macropores, such as pore size, pore diameter, diameter distribution and the arrangement of the pores for the macropores were, as a rule, determined directly by means of imaging techniques. Due to the definite boundaries of the pores in the zeolitic materials according to the present invention, the pore diameters are well defined as well and are therefore easily measured. Insofar as pores with more irregular cross-sections occur, several representative cross sectional diameters can for example be measured on one pore and an arithmetic average can be calculated. A gas adsorption process was used to analyze micropores.

According to the present invention, the pores which are within the single crystals of the zeolitic material form a pore system comprising at least one micropore system and at least one macropore system. This results in an at least bimodal distribution of the pore diameters in the single crystals which shows at least one distribution peak in the range of the micropores and at least one distribution peak in the range of the macropores. However, this does not rule out that two or more distribution peaks appear in the range of the micropores and/or two or more distribution peaks appear in the range of the macropores, and/or one or several distribution peaks appear in the range of the mesopores as well.

As was described above, the pore structure and pore size of the micropores are largely dictated by the type of zeolite or the composition of the zeolitic material which forms the zeolitic framework. As the person skilled in the art is aware, they in turn are influenced by the chemical composition of the oxides used in the production, the process conditions and, optionally, the use of an organic template. In the present invention, the pore structure and pore size of the macropores can be adjusted by means of the production method described in detail below, and e.g. via the geometry and, in particular, the size of the oxide particles used therein.

According to the present invention, the single crystals of the zeolitic material comprises several macropores formed within a microporous zeolitic framework. Thus, the zeolitic framework also serves as a wall structure for the macropores. However, the macropores in the zeolitic material according to the present invention are not necessarily completely enclosed by a microporous zeolitic framework. Rather, at least some of the macropores which are formed within the microporous zeolitic framework form at least one system of interconnected macropores. Usually, the majority or even all of the macropores are part of a system of interconnected macropores. Two or more such systems can also be present adjacent to each other in a single crystal. If two or more systems of interconnected macropores are present in the single crystal, all those systems comprise one or more openings to the crystal surface.

There is typically a passage between interconnected macropores, whereby said passage has a cross sectional diameter slightly smaller than the diameter of the pores so that the passage is "constricted", or narrowed. The diameter of the passage between two interconnected macropores is usually also still in the macroscale range of more than 50 nm. However, in the interconnected macropores of the present invention it is at least in the range of 2 nm or more, preferably 10 nm or more. Therefore, one or more systems of macropores in the form of linear or branched channel systems are preferably formed within the single crystal, which consistently have a cross sectional diameter of 10 nm or more. The network comprises one or more openings to the crystal surface wherein the diameter of these openings is also preferably more than 50 nm. Just like the pore diameter, the diameter of the openings can also be determined by means of imaging techniques, such as electron micrographs.

The diameter of the macropores is at least 50 nm. Preferably, the intracrystalline pore system comprises several macropores with a pore diameter of at least 100 nm, more preferred at least 150 nm. Typically, the pore diameter of the macropores is smaller than 500 nm.

Furthermore, it is preferred that the intracrystalline pore system comprise several macropores with an opening to the crystal surface. Preferably, in this case as well, the diameter of the openings is at least 50 nm, more preferred at least 100 nm and most preferred at least 150 nm. Typically, the diameter of the openings of the macropores is smaller than 500 nm. The diameter of the openings can for example be determined by means of imaging techniques such as electron microscopic analyses.

As is clear from the foregoing, it is also preferred that there be at least one system of macropores in the form of a linear or branched channel system within each single crystal, wherein the system consistently has a cross sectional diameter of at least 10 nm, more preferred at least 50 nm, especially preferred at least 100 nm, and comprises one or more openings to the crystal surface with a diameter of at least 50 nm, more preferred at least 100 nm, and especially preferred at least 150 nm.

It is especially preferred that a system of interconnected macropores extend from at least a first crystal surface to at least a second crystal surface and comprise at least one opening to the first and the second crystal surface, respectively, and in particular that the system comprise openings to each side of the crystal. In an especially preferred embodiment, the macropores are interconnected such that the resulting system of macropores comprises several openings at each side of the crystal. The information given above regarding the preferred diameter of the channels formed by the systems within the single crystals and the preferred diameter of the openings at the surface formed by the pores applies here as well.

Within the single crystals, the macropores can also be arranged in a cellular structure which occurs if the diameters of the passages of interconnected pores are significantly smaller than the diameters of the interconnected pores (which then form a cell).

Since the macropores are formed within a zeolitic framework in the zeolitic material according to the present invention, the macropores are also connected to the network of micropores contained in such a framework. Thus, the single crystals of the zeolitic material according to the present invention comprise a system of macropores which is connected to a system of micropores typical of zeolites, which provides significant benefits for material transport and potential conversions in the zeolitic material.

Depending on the type of zeolite in the zeolitic framework, the single crystals in the zeolitic material according to the present invention can have various shapes and sizes. For example, zeolitic materials with an MFI-type framework (synthesis with TPA cations) are usually present as crystals with a "coffin-like" morphology and an edge length at the long side of a few e.g. 1 to 3 µm.

The zeolitic material according to the present invention can be used in various forms. It can, for example, be present and used as a disordered, usually loose, powder of single crystals or secondary particles formed therefrom. However, the single crystals can also be present as molded articles, e.g. as an extruded, pelletized or tableted molded article. Optionally, suitable binders can be used to ensure dimensional stability. Another option is to apply the single crystals to a suitable carrier in the form of a layer, typically a thin layer with a layer thickness of at least 0.1 or to shape them into a self-supporting membrane e.g. with the help of a binder.

The zeolitic material according to the present invention is suitable for a variety of applications, e.g. those described in the introductory portion with respect to hierarchical zeolites. Typical fields of application include the use as catalysts in heterogeneously catalyzed processes, in particular in the refining of petroleum or petroleum components. Examples include cracking, hydrocracking and reforming. Furthermore, the zeolitic material can also generally be used in the transformation of hydrocarbons, for example in redox reactions, rearrangements and condensation reactions. The materials according to the present invention can also be used as a catalyst in the chemical conversion and utilization of bio masses or in the selective degradation of macromolecular, carbon-based materials. Other possible applications include for example sorption processes which can for example be carried out in the context of a purification or separation process. Furthermore, the materials according to the present invention are suitable in the production of membranes and composite materials, as well as supports for the immobilization of various macromolecules, such as e.g. enzymes or dyes.

The method in accordance with the invention for the production of the zeolitic material described above comprises the following steps:

a) providing a mixture of (i) porous particles of an oxide capable of forming a framework of a zeolitic material and (ii) an organic template for the zeolite synthesis;

b) converting the mixture into a zeolitic material by heating the mixture in contact with water vapor.

As was described above, typical network-forming elements whose oxides are suitable for providing a framework of a zeolitic material are elements of the main groups 3, 4 and 5 of the periodic table of the elements (groups 13, 14 and 15 according to current IUPAC classification). Examples include one or more elements selected from Si, Al, P, B, Ti, or Ga. Therefore, particles formed from one or more oxides of the above-mentioned elements are preferably used in the method according to the present invention. $SiO_2$ particles are especially preferred.

The oxide particles used in step a) are porous and preferably have pore diameters of 1 to 100 nm, e.g. determined by means of sorption processes using gases. Mesoporous particles, e.g. with a pore diameter of 2 to 50 nm are especially preferred. It is furthermore preferred that at least 80% of all pores, based on the number of pores, preferably at least 90% of all pores, have diameters in those ranges.

The particles typically have a particle size between 50 nm and 2,000 nm, preferably between 100 nm and 800 nm, and especially preferred from 200 nm to 600 nm. The particle size can e.g. be determined by means of electron micrographs. It is furthermore preferred that at least 80% of all particles, based on the number of particles, preferably at least 90% of all particles, have sizes in those ranges. With respect to the particle shape, spherical particles are preferred.

Furthermore, it is preferred that the particles for use in the method according to the present invention exhibit a particle size distribution with a limited peak width, for example determined by means of laser light scattering. In particular, the peak(s) of the particle size distribution preferably show a peak halfwidth which is no larger than the range resulting from the peak maximum value±30%, especially preferred±20%. Preferably, particles with a monomodal particle size distribution are used, and especially preferred particles with a monomodal particle size distribution and the also preferred peak halfwidth, as explained above.

Therefore, spherical mesoporous $SiO_2$ particles with a particle size of 100 nm to 800 nm, especially preferred 200 nm to 600 nm, are especially preferred for use in the method according to the present invention. Such particles are easily obtainable, for example by means of the Stöber process wherein a silicon source, typically a silicic acid ester such as e.g. tetraethyl orthosilicate (TEOS), is hydrolyzed in a mixture of water, ammonia, an alcohol like ethanol, and a surfactant, and condensed. $SiO_2$ particles which are obtainable by means of the modified Stöber process are preferably used in the present invention, as it is for example described in Gao et al. [Gao et al., J. Phys. Chem. C, 113 (2009) 12753] and in Example 2 below.

According to the present invention, the porous oxide particles are used in a mixture with an organic template suitable for zeolite synthesis. Such organic templates, also referred to as structure-determining substances, are known to the person skilled in the art. They are usually alcohols, phosphorus compounds, or amines, preferably tetraorganoammonium cations or tetraoorganophosphonium cations which are generally used in the form of their salts, such as e.g. as halides or hydroxides.

More preferred, they are tetraorganoammonium cations or tetraoorganophosphonium cations which carry four hydrocarbon groups, in particular hydrocarbon groups which are independently selected from alkyl, aryl and alkaryl groups. The alkyl groups are preferably C1-C4 alkyl groups. Phenyl is preferred as aryl group, and benzyl as alkaryl group. Tetraalkylammonium cations, such as the tetramethylammonium cation, e.g. in form of tetramethylammonium hydroxide, the tetraethylammonium cation, e.g. in form of tetraethylammonium hydroxide, the tetrapropylammonium cation, e.g. in form of tetrapropylammonium hydroxide, the tetrabutylammonium cation, or the triethylmethylammonium cation are preferred as tetraorganoammonium cations. Additional preferred examples include the tetrabutylphosphium cation, the triphenylbenzylphosphonium cation or the trimethylbenzylammonium cation. Also, primary, secondary or cyclic amines (such as piperidine), imines (such as hexamethylene imine) or alcohols can also be used as organic template.

The following table presents a non-restrictive overview of common organic molecules as templates and the corresponding resulting zeolitic frameworks:

| Organic molecules | Zeolites (network type) |
|---|---|
| TMA—(tetramethylammonium)$^+$ | X(FAU), sodalite (SOD), ZSM-10 (MOZ), ZSM-3 (EMT-FAU), ZSM-5 (MFI), ZSM-11 (MEL), ZSM-39 (MTN) |
| TEA—(tetraethylammonium)$^+$ | ZSM-5 (MFI), ZSM-11 (MEL), SAPO-34 (CHA), UZM-5 (UFI), ZSM-20 (EMT-FAU), ZSM-12 (MTW), beta (BEA) |
| TBP—(tetrabutylphosphonium)$^+$ | ZSM-5 (MFI), ZSM-11 (MEL) |
| TPA—(tetrapropylammonium)$^+$ | ZSM-5 (MFI), AlPO$_4$-5 (AFI), ZETA-1, ZETA-3 |
| TPBP—(triphenylbenzylphosphonium)$^+$ | ZSM-11 (MEL) |
| TMBA—(trimethylbenzylammonium)$^+$ | ZSM-11 (MEL) |
| TBA—(tetrabutylammonium)$^+$ | ZSM-5 (MFI), ZSM-11 (MEL) |
| TEMA—(triethylmethylammonium)$^+$ | ZSM-12 (MTW) |
| Primary and secondary amines | ZSM-5 (MFI), ZSM-22 (TON), ZSM-35 (FER) |
| Piperidine | Ferrierite (FER) |
| HMI—(hexamethylene imine) | PSH-3 (MWW), ZSM-5 (MFI), SAPO-35 (LEV) |
| Alcohols | ZSM-5 (MFI) |

In the mixture provided in step a), the organic template is preferably present on the surface and/or in the pores of the porous particles, more preferred, the template is present on the surface and in the pores of the porous particles.

For providing the mixture of the porous oxide particles and the organic template, the two components can be blended in different ways. Preferably, the organic template is dissolved or dispersed in a solvent, especially in water as a solvent, and brought into contact with the oxide particles in the form of the solution or dispersion.

In particular, it is preferred that the porous oxide particles be impregnated with a solution or dispersion of the organic template. For this purpose, the particles can for example be submerged in the solution or dispersion, or the solution or dispersion is applied to the particles, e.g. by spraying. After impregnation, the solvent can be partially or completely removed by evaporation. This way, no solution or dispersion residue has to remain after impregnation so that the ratios of oxide and template can easily be adjusted. The porous oxide particles can for example simply be left standing for a while in an aqueous solution of the organic template in an open container at room temperature so that impregnated particles are obtained after the water has evaporated and the particles are sufficiently dry for further processing.

Preferred ratios of template to oxide in the porous oxide particles, expressed as molar amount of template to molar amount of the element present as oxide, in particular Si, are preferably in the range of 0.01 to 0.50, preferably 0.05 to 0.30, more preferred 0.08 to 0.20 and especially preferred 0.10 to 0.15.

A preferred method for producing a zeolitic framework formed by two or more oxides uses as a starting material in step a) a mixture of (i) the porous particles of an oxide capable of forming a framework of a zeolitic material, (ii) an organic template for the zeolite synthesis and additionally (iii) a precursor compound of one or more additional oxides of network-forming elements selected from elements of the main groups 3, 4 and 5 of the periodic table of the elements.

Components (i) and (ii) and the procedure of providing a mixture thereof have already been described above. The precursor compound is a compound known to the person skilled in the art, for example salts, including a hydroxide, alkoxides or metallates, which can be converted to oxides when subjected to heat and/or moisture. It is especially preferred, in particular in combination with porous SiO$_2$ particles, that the precursor compound is an aluminum compound, a titanium compound, a phosphorus compound or a boron compound, or a combination of two or more thereof. Examples of aluminum compounds which are suitable as precursor compounds include aluminum salts such as aluminum nitrate, aluminates such as e.g. alkali aluminate, aluminum alcoholates such as e.g. aluminum triisopropylate, or aluminum hydrates such as e.g. aluminum trihydrate. Examples of titanium compounds include titanium salts, titanates, titanium tetraethanolate, or titanium ethoxy compounds such as titanium isopropoxide. Examples of phosphorus compounds include phosphates or phosphoric acid esters. Examples of boron compounds include boric acid, borates or boric acid esters such as e.g. triethyl borate or trimethyl borate. The precursor compound can be added to the mixture before, during or after the addition of the organic template. Preferably, it is added after the addition of the template. The precursor compound is typically added in the form of a solution or dispersion, preferably in water as a solvent. After addition of the solution or dispersion, the solvent can be partially or completely removed, e.g. by evaporation.

If such a precursor compound is used, the ratio of the precursor compound to the oxide in the porous oxide particles, expressed as the molar amount of the atoms of the element(s) selected from one or more elements of the main groups 3, 4 and 5 of the periodic table of the elements to the molar amount of the atoms of the element present as oxide in the porous particles, typically in a range of at most 1, preferably smaller than 0.2 and especially preferred smaller than 0.1.

According to an especially preferred embodiment, spherical, mesoporous SiO$_2$ particles with a particle size of 100 nm to 800 nm, in particular 200 nm to 600 nm, are impregnated with a tetraalkylammonium salt to obtain the mixture in step a) of the method according to the present invention, wherein the molar ratio of the template to the molar amount of SiO$_2$ is preferably in the range of 0.01 to 0.50, more preferred 0.05 to 0.30, even more preferred 0.08 to 0.20 and especially preferred 0.10 to 0.15. Optionally, an aluminum salt is also added to the SiO$_2$ particles.

In particular, according to the method of the present invention, it is not necessary to add a particulate template (also referred to as a macro template) to the mixture provided in step a) which then has to be removed from the zeolitic framework after it is obtained in order to create macropores. The use of zeolite seed crystals in the mixture is not necessary, either.

The mixture prepared in step a) can be present in the form of a powder, but also in the form of a molded article, obtainable for example by tableting or extrusion, a supported layer or a self-supporting membrane, and be processed further in step b).

In the subsequent step b), the mixture provided in step a) is converted into the zeolitic material by heating in the presence of water vapor. Surprisingly, it was found that the porous oxide particles both serve as starting material for the formation of the zeolitic framework and as template for the formation of macropores within this structure. As a result of this conversion the zeolitic material of the present invention is formed directly, comprising zeolitic single crystals, characterized in that the single crystals each have an intracrystalline pore system comprising at least one micropore system and at least one macropore system, wherein within each single crystal several macropores are present within a microporous zeolitic framework, and at least one system of interconnected macropores is present which comprises one or more openings to the crystal surface.

The conversion in step b) can for example be carried out by introducing the mixture provided in step a) into an autoclave containing water which, upon heating, at least partially enters the vapor phase. The material to be converted should not come into contact with liquid water. Additional pressurization is not necessary. Alternatively, the mixture provided in step a) can also be converted under atmospheric pressure in the presence of moist air in step b), e.g. in a climatic chamber or an oven.

The synthesis temperature is typically between 50° C. and 250° C., preferably between 80° C. and 160° C. and especially preferred between 90° C. and 130° C. The duration of the synthesis is usually between 12 h (hours) and 10 d (days), however, preferably between 1 d and 5 d, and especially preferred between 2 d and 4 d.

After completion of the conversion, the reaction mixture is left to cool. The product can then be subjected to common aftertreatment steps such as washing. However, one of the advantages of the method according to the present invention is the fact that the resulting product is already macroporous after synthesis so that the aftertreatment steps common after synthesis in other methods to remove the macro template can be omitted.

The properties of the material according to the present invention can optionally be optimized for specific applications by means of common post-synthetic modifications such as demetallization, ion exchange or thermal treatment known to the person skilled in the art.

Important aspects of the present invention are summarized in the following items.

1. Zeolitic material comprising zeolitic single crystals, characterized in that the single crystals each have an intracrystalline pore system comprising at least one micropore system and at least one macropore system, wherein within each single crystal several macropores are present within a microporous zeolitic framework, and at least one system of interconnected macropores is present which comprises one or more openings to the crystal surface.

2. Zeolitic material according to item 1, characterized in that several macropores are present within the single crystals in a cellular structure.

3. Zeolitic material according to item 1 or 2, characterized in that the intracrystalline pore system comprises several macropores with a pore diameter of at least 100 nm.

4. Zeolitic material according to any of items 1 to 3, characterized in that the intracrystalline pore system comprises several macropores with a pore diameter of at least 150 nm.

5. Zeolitic material according to any of items 1 to 4, characterized in that the intracrystalline pore system comprises several macropores open to the crystal surface whose opening diameter is at least 100 nm.

6. Zeolitic material according to any of items 1 to 4, characterized in that the intracrystalline pore system comprises several macropores open to the crystal surface whose opening diameter is at least 150 nm.

7. Zeolitic material according to any of items 1 to 6, characterized in that a system of interconnected macropores extends from at least a first crystal surface to at least a second crystal surface and comprises at least one opening to the first and the second crystal surface, respectively.

8. Zeolitic material according to any of items 1 to 7, characterized in that the microporous zeolitic framework is formed from oxides of network-forming elements selected from one or more elements of the main groups 3, 4 and 5 of the periodic table of the elements.

9. Zeolitic material according to any of items 1 to 8, characterized in that the microporous zeolitic framework is formed from of tetrahedral $SiO_2$ units, wherein up to 30%, preferably up to 20%, and more preferred up to 10%, of all silicon atoms in the framework can be replaced with one or more different network-forming elements selected from elements of the main groups 3, 4 and 5 of the periodic table of the elements.

10. Zeolitic material according to any of items 1 to 8, characterized in that the microporous zeolitic framework is formed from tetrahedral $SiO_2$ units, wherein up to 30%, preferably up to 20%, and more preferred up to 10%, of all silicon atoms in the framework can be replaced with one or more elements selected from boron, aluminum, phosphorus and titanium.

11. Zeolitic material according to any of items 1 to 8, characterized in that the microporous zeolitic framework is formed from tetrahedral $SiO_2$ units, wherein up to 30%, preferably up to 20%, and more preferred up to 10%, of all silicon atoms in the framework can be replaced with aluminum.

12. Zeolitic material according to any of items 1 to 8, characterized in that the microporous zeolitic framework is formed from of tetrahedral $SiO_2$ units.

13. Zeolitic material according to any of items 1 to 12, characterized in that the microporous zeolitic framework is a highly siliceous zeolite structure.

14. Zeolitic material according to item 13, characterized in that the highly siliceous zeolite structure is an MFI, BEA, MOR, FER, MWW, MTW, DDR, CHA, AEI or MEL zeolite structure, preferable an MFI or BEA zeolite structure.

15. Zeolitic material according to any of items 1 to 14, characterized in that the material is present in the form of a disordered powder, a molded article, a supported layer or a self-supporting membrane.

16. Method for the production of a zeolitic material according to any of items 1 to 7, characterized in that the method comprises the following steps:
    a) providing a mixture of (i) porous particles of an oxide capable of forming a framework of a zeolitic material and (ii) an organic template for the zeolite synthesis;
    b) converting the mixture into a zeolitic material by heating the mixture in contact with water vapor.

17. Method according to item 16, characterized in that providing the mixture in step a) comprises impregnating the porous particles with a solution or a dispersion of the organic template, optionally followed by a partial or complete removal of the solvent of the solution or dispersion.

18. Method according to item 16 or 17, characterized in that in the mixture provided in step a), the organic template is present on the surface and/or in the pores of the porous particles.

19. Method according to items 16 or 17, characterized in that in the mixture provided in step a), the organic template is present on the surface and in the pores of the porous particles.

20. Method according to any of items 16 to 19, wherein the organic template is a tetraorgano ammonium cation or a tetraorgano phosphonium cation.

21. Method according to any of items 16 to 20, characterized in that the porous particles have pores with a pore diameter of 1 to 100 nm.

22. Method according to any of items 16 to 20, characterized in that the porous particles are mesoporous particles.

23. Method according to any of items 16 to 22, characterized in that the porous particles are spherical particles.

24. Method according to any of items 16 to 23, characterized in that the porous particles have a particle size between 50 nm and 2,000 nm.

25. Method according to any of items 16 to 23, characterized in that the porous particles have a particle size between 100 nm and 800 nm.

26. Method according to any of items 16 to 23, characterized in that the porous particles have a particle size between 200 nm and 600 nm.

27. Method according to any of items 16 to 26, characterized in that porous particles are formed from one or more oxides of network-forming elements selected from one or more elements of the main groups 3, 4 and 5 of the periodic table of the elements.

28. Method according to any of items 16 to 26, characterized in that the porous particles are $SiO_2$ particles.

29. Method according to any of items 16 to 28, characterized in that the mixture provided in step a) additionally comprises one or more precursor compounds of one or more oxides of network-forming elements selected from elements of the main groups 3, 4 and 5 of the periodic table of the elements.

30. Method according to item 29, characterized in that the precursor compound is selected from a precursor compound of an aluminum oxide, a titanium oxide, a phosphorus oxide and a boric oxide, or from combinations of such precursor compounds.

31. Method according to any of items 16 to 30, characterized in that the components of the mixture in step a) are selected such that the framework of the zeolitic material prepared by means of this method is formed from tetrahedral $SiO_2$ units, wherein up to 30%, preferably up to 20%, and more preferred up to 10%, of all silicon atoms in the framework can be replaced with one or more network-forming elements selected from elements of the main groups 3, 4 and 5 of the periodic table of the elements.

32. Method according to any of items 16 to 30, characterized in that the components of the mixture in step a) are selected such that the framework of the zeolitic material produced by means of this method is formed from tetrahedral $SiO_2$ units, wherein up to 30%, preferably up to 20%, and more preferred up to 10%, of all silicon atoms in the framework can be replaced with one or more elements selected from boron, aluminum, phosphorus and titanium.

33. Method according to any of items 16 to 30, characterized in that the components of the mixture in step a) are selected such that the framework of the zeolitic material produced by means of this method is formed from tetrahedral $SiO_2$ units, wherein up to 30%, preferably up to 20%, and more preferred up to 10%, of all silicon atoms in the framework can be replaced with aluminum.

34. Method according to any of items 16 to 28, characterized in that the components of the mixture in step a) are selected such that the framework of the zeolitic material produced by means of this method is formed from tetrahedral $SiO_2$ units.

35. Method according to any of items 16 to 34, characterized in that the components of the mixture in step a) are selected such that the framework of the zeolitic material produced by means of this method is a highly siliceous zeolite structure.

36. Method according to item 35, characterized in that the highly siliceous zeolite structure is an MFI, BEA, MOR, FER, MWW, MTW, DDR, CHA, AEI or MEL type zeolite structure, preferably an MFI or BEA zeolite structure.

37. Method according to any of items 16 to 36, characterized in that in the mixture of step a), a molar ratio of the organic template to the oxide of 0.01 to 0.50 is adjusted, preferably 0.05 to 0.30, more preferred 0.08 to 0.20 and especially preferred 0.10 to 0.15.

38. Method according to any of items 16 to 37, characterized in that the mixture provided in step a) is present in the form of a disordered powder, a molded article or a supported layer.

39. Method according to any of items 16 to 38, characterized in that the conversion in step b) is carried out in an autoclave containing water.

40. Method according to any of items 16 to 39, characterized in that during the conversion in step b), the mixture provided in step a) does not come into contact with liquid water.

41. Method according to any of items 16 to 38, characterized in that the conversion in step b) is carried out under atmospheric conditions in contact with humid air.

42. Method according to any of items 16 to 41, characterized in that the conversion in step b) is carried out by heating the mixture to a temperature of 50 to 250° C., preferably 80 to 160° C., especially preferred 90 to 130° C.

43. Method according to any of items 16 to 42, characterized in that the duration of the conversion in step b) is between 12 h and 10 d, preferably between 1 d and 5 d, and especially preferred between 2 d and 4 d.

44. Use of the zeolitic material according to any of items 1 to 15 as a catalyst in a heterogeneously catalyzed process.

45. Use according to item 44, wherein the process is the refining of petroleum or petroleum components.

46. Use according to item 45, wherein the refining comprises one or more process steps selected from cracking, hydrocracking and reforming.

47. Use of the zeolitic material according to any of items 1 to 15 in a sorption process.

48. Use according to item 47, wherein the sorption process is carried out in the context the framework of a purification or separation process.

49. Use of the zeolitic material according to any of items 1 to 15 as a support for the immobilization of guest molecules.

EXAMPLES

Example 1 (Comparative Example): Preparation of Conventional MFI-Type Crystals Using a Standard Synthesis Method 133 g of distilled water and 16 g of tetrapropylammonium hydroxide solution (40 wt % TPAOH solution) were mixed in a polypropylene flask. 15 g of tetraethyl orthosilicate (TEOS) were added and the mixture was stirred for 4 h. 80 g of the synthesis mixture were transferred into a Teflon vessel (V=120 ml), and placed into an autoclave which was closed and pressurized. The subsequent crystallization was carried out at 175° C. for 48 hours in a preheated convection oven. Then the autoclave was cooled to room temperature with cold water, opened, and the product of the synthesis was separated from the excess solution by means of centrifugation and then washed four times with distilled water (pH 8). Drying was carried out overnight at 75° C.

FIG. 3 shows an electron microscope (REM) image of the resulting MFI-type crystals. The typical hexagonal crystal morphology is clearly visible.

Example 2 (Preparation Example): Preparation of Porous $SiO_2$ Particles as Starting Products for the Synthesis of Zeolite 828 g of distilled water were provided in a polypropylene beaker and 6 g of hexadecyltrimethylammonium bromide (CTAB, 98%, Sigma Aldrich) were added while stirring. 2,876 g of technical ethanol (96%) were added to this mixture and stirring was continued until a clear solution was obtained. Then 144 g of ammonia solution (25 wt %) were added while stirring, and stirring was continued for 1 more hour. Then 20 g of tetraethyl orthosilicate (98%, Alfar Aesar) were added and the resulting mixture was stirred for 2 more hours. After that, the resulting $SiO_2$ particles were separated from the synthesis mixture by means of centrifugation at 10,000 rpm and washed three times with distilled water. Finally, the purified $SiO_2$ particles were dried overnight at 75° C. in the air and then calcined at 550° C. in ambient air.

The porosity of the thus prepared $SiO_2$ particles was confirmed by means of X-ray analysis and $N_2$ physisorption; the particles comprise mesopores. Furthermore, these particles had particle diameters between 400 and 500 nm, as shown in the electron micrographs in FIGS. 3 to 5.

Example 3: Preparation of Aluminum-Free Macroporous Zeolite Single Crystals

In a porcelain dish, 0.340 g of tetrapropylammonium hydroxide solution (TPAOH, 40 wt %, Clariant) were mixed with 0.25 g of $SiO_2$ particles (Example 2) and left at room temperature for 16 h. Then the resulting $SiO_2$ particles impregnated with TPAOH were finely ground with a pestle in the porcelain dish and transferred to a 50 ml Teflon vessel as shown in FIG. 2. The Teflon insert contained 24 g of water. Care was taken that the water did not come into contact with the TPAOH-$SiO_2$ particles. Then the Teflon vessel was placed in a stainless steel autoclave which was closed to resist pressure. Finally, the autoclave was heated to 110° C. for 4 days. At the end of the 4 days, the autoclave was cooled to room temperature. The solid material was isolated by filtration, washed with distilled water, dried overnight at 75° C. and subsequently characterized.

Electron micrographs showed that the resulting solid product consists of single crystals with interconnected intracrystalline macropores which cannot be obtained by means of the conventional synthesis method (Example 1). X-ray diffraction shows that the product is highly crystalline MFI-type zeolite.

Example 4: Preparation of Aluminum-Containing Macroporous Zeolite Single Crystals In a porcelain dish, 0.340 g of 40 wt % tetrapropylammonium hydroxide solution were mixed with 0.25 g of $SiO_2$ particles (Example 2) and left at room temperature for 16 h. The $SiO_2$ particles were prepared according to Example 2, but at a temperature of 40° C., not room temperature. This allowed the preparation of smaller $SiO_2$ particles with diameters between 200 and 350 nm. After drying, 0.1 g of 0.001% aluminum solution prepared from $Al(NO_3)*9H_2O$ were added and the mixture was left at room temperature for 6 h. Then the $SiO_2$ particles, which contained TPAOH and aluminum, were ground with a pestle in the porcelain dish and transferred to a 50 ml Teflon vessel as shown in FIG. 2. The Teflon insert contained 24 g of water. The water did not come into contact with the TPAOH-$Al_2O_3$—$SiO_2$ particles. Then the Teflon vessel was placed in a stainless steel autoclave which was closed so as to resist pressure. Finally, the autoclave was heated to 110° C. for 4 days. At the end of the 4 days, the autoclave was cooled to room temperature, the solid material was isolated by filtration, washed with distilled water, dried overnight at 75° C. and subsequently characterized.

The X-ray analysis of the resulting solid showed the diffraction pattern typical for highly crystalline MFI-type zeolite. Analyses with an electron microscope showed that mainly single crystals with distinctive intracrystalline macropores were obtained and no further secondary treatments of the product were necessary.

Example 5 (Preparation Example): Preparation of Porous $Al_2O_3$—$SiO_2$ Particles as Starting Products for the Synthesis of Zeolite $Al_2O_3$—$SiO_2$ particles as starting products for the preparation of aluminum-containing nano zeolite according to the present invention were prepared using a modified process according to Ahmed et. al. [Ahmed et. al., Industrial & Engineering Chemistry Research, 49 (2010) 602]. In a typical approach, 4 g of polyvinyl alcohol (PVA, Mw 31-50 k, 98 wt % from Sigma-Aldrich) were dissolved in 105 g of deionized water at 80° C. in a beaker. After about 20 to 30 minutes, 0.12 g of sodium aluminate solution (53 wt % $Al_2O_3$ and 43 wt % $Na_2O$ from Chemiewerk Bad Kostritz GmbH) were added to the PVA solution at 80° C. while stirring. Stirring of the resulting mixture was continued until the sodium aluminate was completely dissolved. Then the solution was cooled to room temperature and transferred to a 500 ml glass stirred tank reactor. After that, 1.61 g of CTAB and 101 g of ethanol were added to the cooled mixture while stirring and the mixture was heated to 40° C. Finally, 7.2 g of TEOS were added and the resulting synthesis mixture with a molar composition of 1 TEOS:0.006 $Al_2O_3$:2.9 $NH_3$:0.12 CTAB:162 $H_2O$:58 ethanol:0.003 PVA was stirred for about another 40 h at 40° C. The resulting $SiO_2$ particles were separated from the synthesis mixture by means of centrifugation at 10,000 rpm and washed three times with deionized water. At the end, the purified $Al_2O_3$—$SiO_2$ particles were dried overnight at 75° C. in the air and then calcined at 550° C. in ambient air.

The structure and porosity of the thus prepared $SiO_2$ particles were examined by means of X-ray analysis and N2 physisorption and it was confirmed that the particles comprise mesopores. Furthermore, these particles had particle diameters between 550 and 700 nm, as shown in the electron micrograph in FIG. 12.

Example 6: Preparation of Macroporous Aluminum-Containing Zeolitic Single Crystals by Crystallizing Aluminum-Containing Mesoporous Silica Particles 0.25 g of the aluminum-containing, mesoporous spherical silica particles prepared in Example 5 and 0.347 g of aqueous 40 wt % tetrapropylammonium hydroxide solution were weighed out in a porcelain dish and mixed. The mixture was dried in a drying cabinet with circulating air for 1.5 h at 40° C. while at the same time it was repeatedly mixed and crushed. The dried mixture was left for 16 h at room temperature (RT). After that, the porcelain dish with the dried mixture was transferred to a 50 ml Teflon insert (as shown in FIG. 2). The autoclave contained 24 g of distilled water which did not come into contact with the porcelain dish or its contents. The Teflon insert was placed in a stainless steel autoclave which was closed so as to resist pressure. The autoclave was placed in a drying chamber preheated to 150° C. and crystallization was carried out for 3 days at 150° C. At the end of the crystallization period the autoclave was cooled to room temperature, the solid was removed from the porcelain dish by means of filtration, washed with distilled water and dried overnight at 70° C. Then the dried product was characterized.

The X-ray analysis of the resulting solid showed the diffraction pattern typical for highly crystalline MFI-type zeolite (FIG. 14). Analyses with an electron microscope showed that mainly single crystals with distinctive intracrystalline macropores were obtained. Some of these macropores are clogged by residues of silica particles (see FIG. 15).

In order to remove residue from the macropores, the obtained product was subjected to an alkaline treatment. For this treatment, 0.05 g of the sample were mixed with 5 g of an aqueous 1M sodium hydroxide solution in a 25 ml propylene Erlenmeyer flask. The flask was shaken for 48 h at room temperature. Then the solid was separated by means of filtration, washed with distilled water and dried overnight at 75° C. Then the product was characterized.

Analyses with an electron microscope showed that mainly single crystals with distinctive intracrystalline macropores were obtained which were free of residues (see FIG. 16).

Example 7: Preparation of Macroporous Aluminum-Containing Zeolitic Single Crystals by Crystallizing Aluminum-Containing Mesoporous Silica Particles 0.25 g of the aluminum-containing, mesoporous spherical silica particles prepared in Example 5 and 0.347 g of aqueous 40 wt % tetrapropylammonium hydroxide solution, as well as 0.25 g of an aqueous 0.5M sodium hydroxide solution were weighed out in a porcelain dish and mixed. The mixture was dried in a drying cabinet with circulating air for 2 h at 40° C. while at the same time it was repeatedly mixed and crushed. The dried mixture was left for 16 h at room temperature (RT). After that, the porcelain dish with the dried mixture was transferred to a 50 ml Teflon insert (as shown in FIG. 2). The autoclave contained 24 g of distilled water which did not come into contact with the porcelain dish or its contents. The Teflon insert was placed in a stainless steel autoclave which was closed and pressurized. The autoclave was placed in a drying chamber preheated to 150° C. and crystallization was carried out for 3 days at 150° C. At the end of the crystallization period the autoclave was cooled to room temperature, the solid was removed from the porcelain dish by means of filtration, washed with distilled water and dried overnight at 70° C. Then the dried product was characterized.

The X-ray analysis of the resulting solid showed the diffraction pattern typical for highly crystalline MFI-type zeolite (FIG. 17). Analyses with an electron microscope showed that single crystals with intracrystalline macropores were obtained. FIG. 18 illustrates that the pores are clear after the synthesis.

Figure 1:
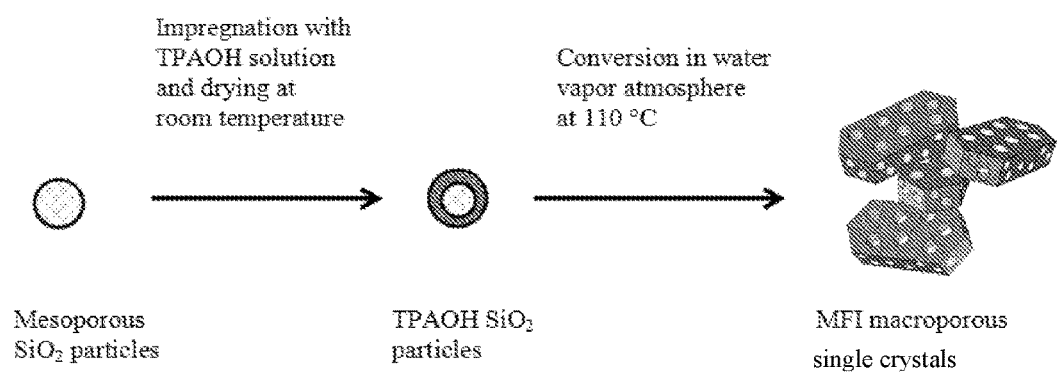
FIG. 1 shows a schematic illustration of the main steps in the production of single crystals of macroporous MFI-type zeolite.
Figure 2:
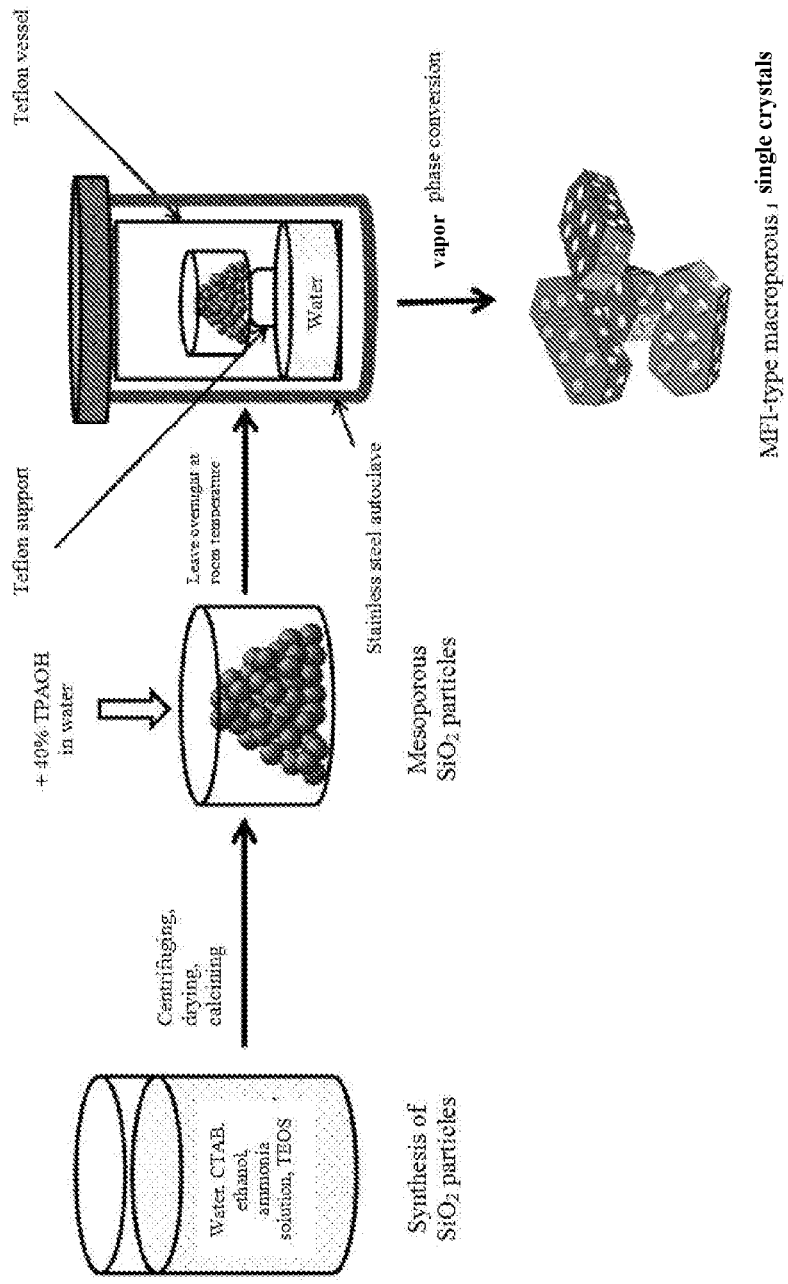
FIG. 2 shows a schematic illustration of the various steps and the experimental setup in the preparation of single crystals of macroporous MFI-type zeolite.
Figure 3:
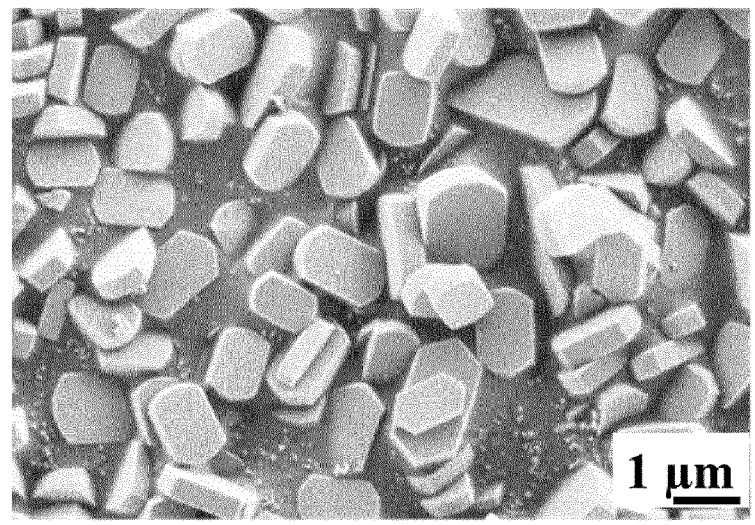
FIG. 3 shows an REM image of a conventionally prepared MFI-type zeolite.
Figure 4:
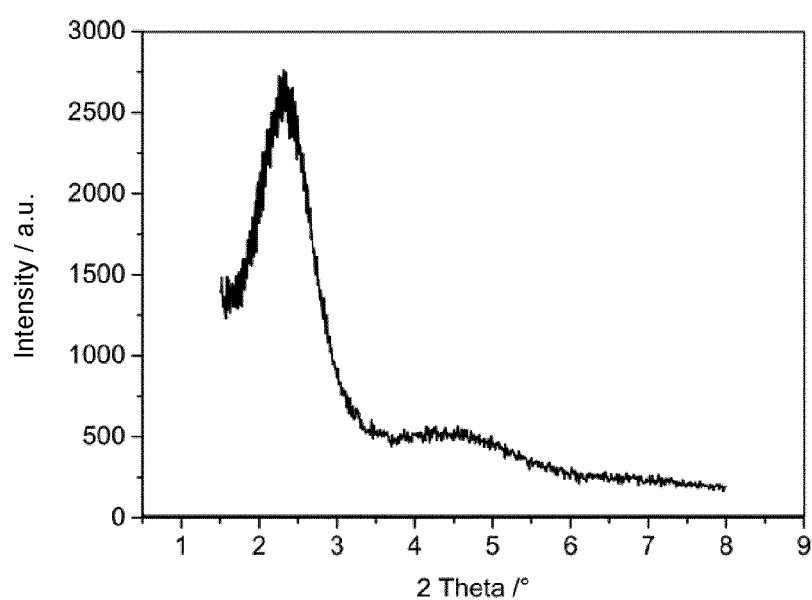
FIG. 4 shows an X-ray diffractogram of the calcined mesoporous silicon dioxide particles of Example 2.
Figure 5:
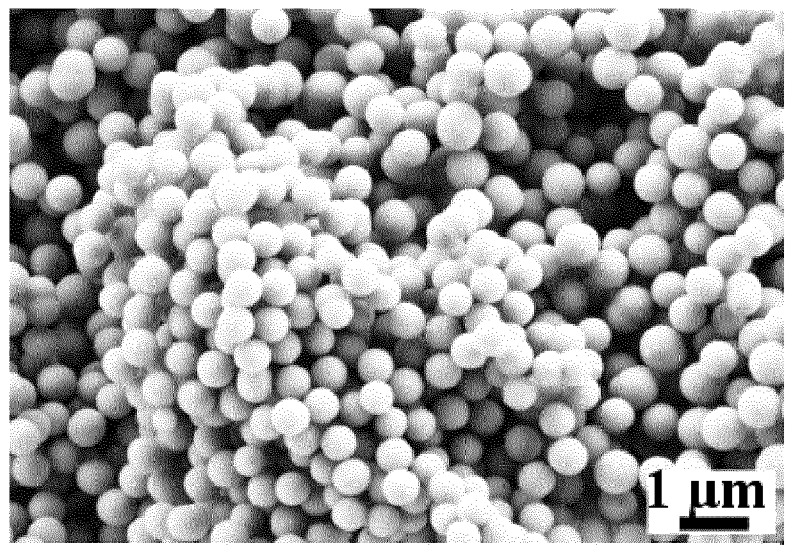
FIG. 5 shows a scanning electron micrograph of the calcined mesoporous silicon dioxide particles of Example 2.
Figure 6A:
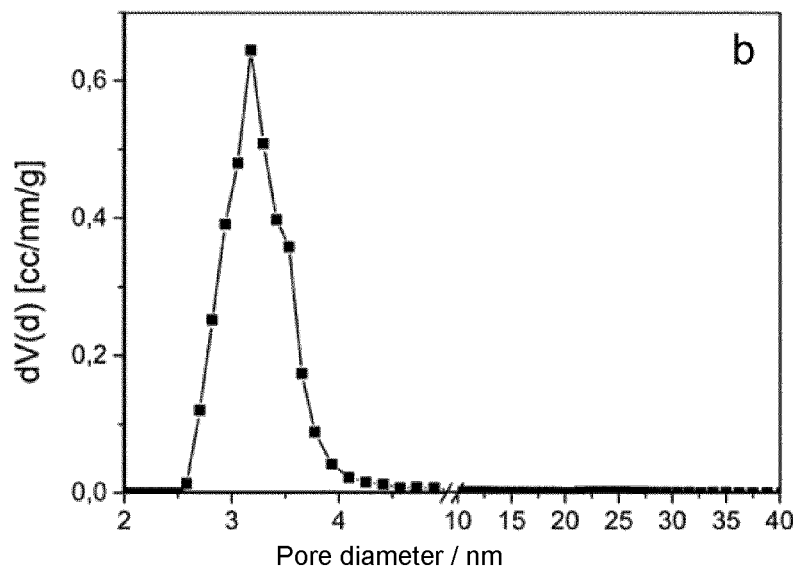
FIG. 6 shows the nitrogen sorption isotherm (a) and DFT pore size distribution (b) of the calcined mesoporous silicon dioxide particles of Example 2.
Figure 6B:
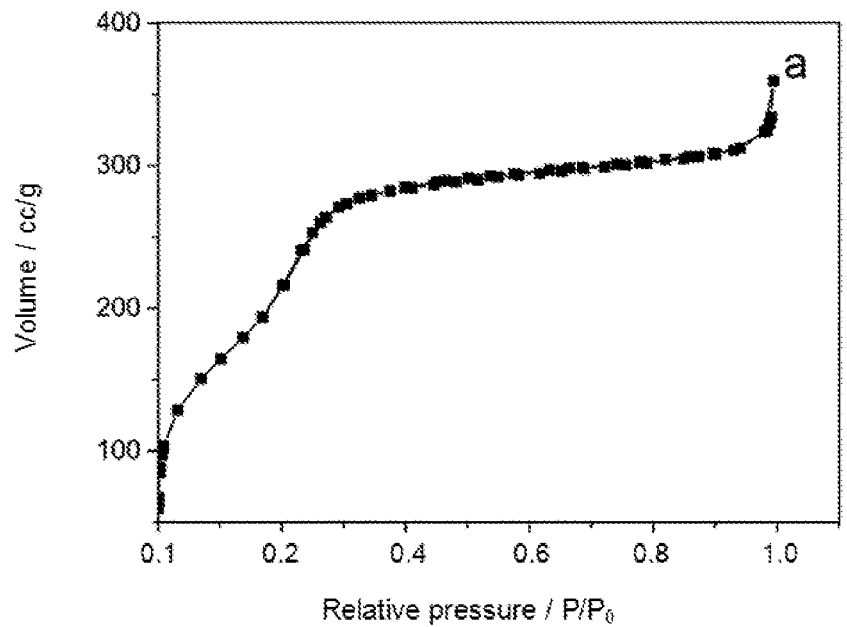
Figure 7:
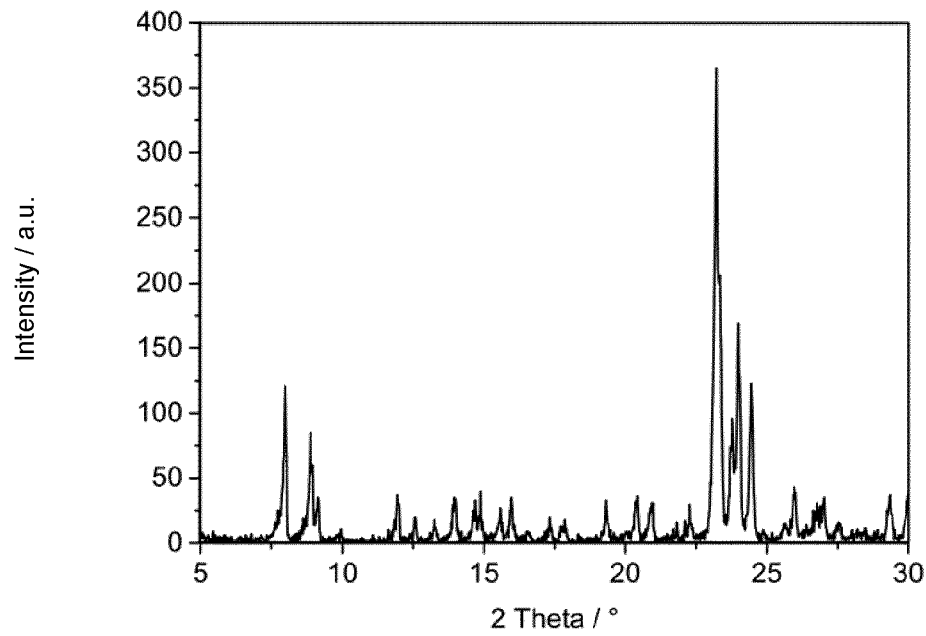
FIG. 7 shows an X-ray diffractogram of the single crystals of a macroporous MFI-type zeolite without aluminum according to the present invention.
Figure 8:
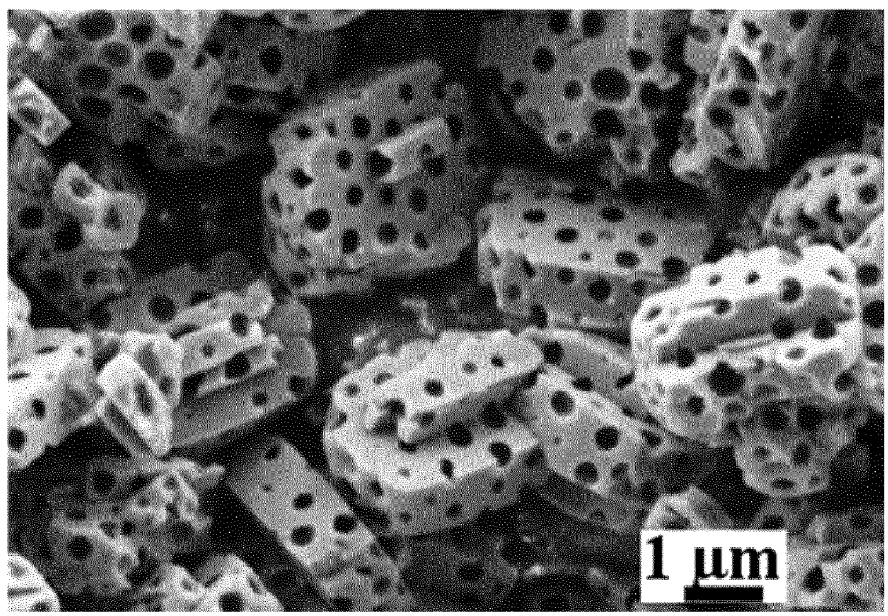
FIG. 8 shows a scanning electron micrograph of the single crystals of a macroporous MFI-type zeolite without aluminum according to the present invention.
Figure 9:
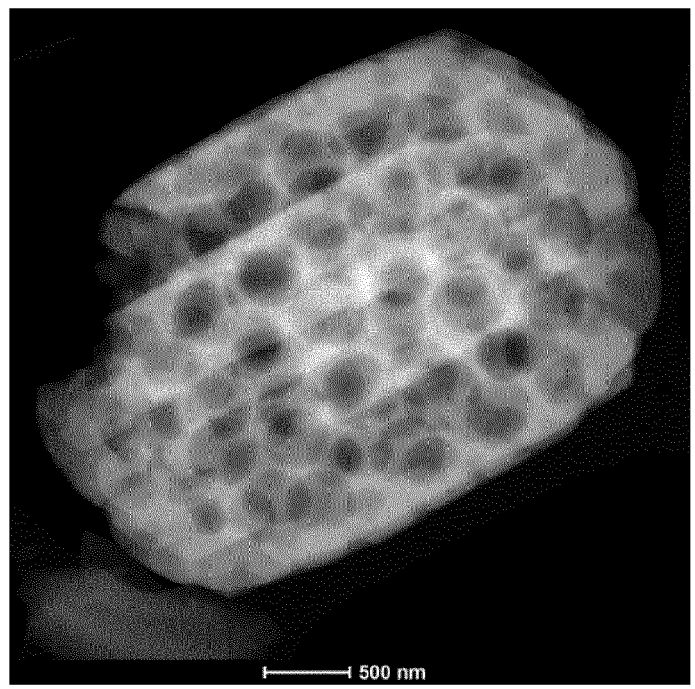
FIG. 9 shows a scanning electron micrograph of the single crystals of a macroporous MFI-type zeolite without aluminum according to the present invention.
Figure 10:
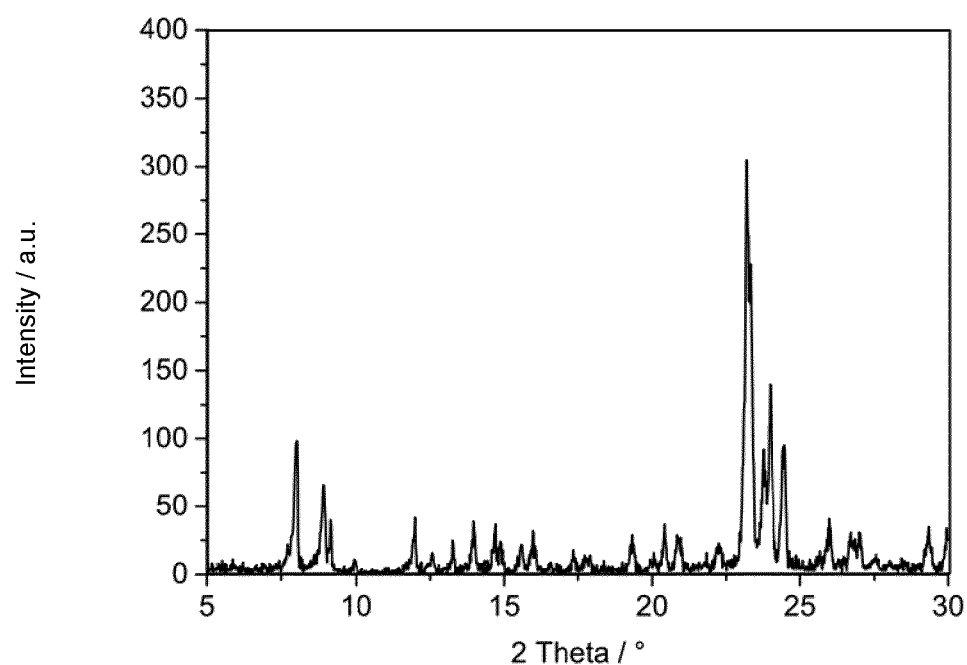
FIG. 10 shows an X-ray diffractogram of the aluminum-containing single crystals of a macroporous MFI-type zeolite with aluminum according to the present invention.
Figure 11:
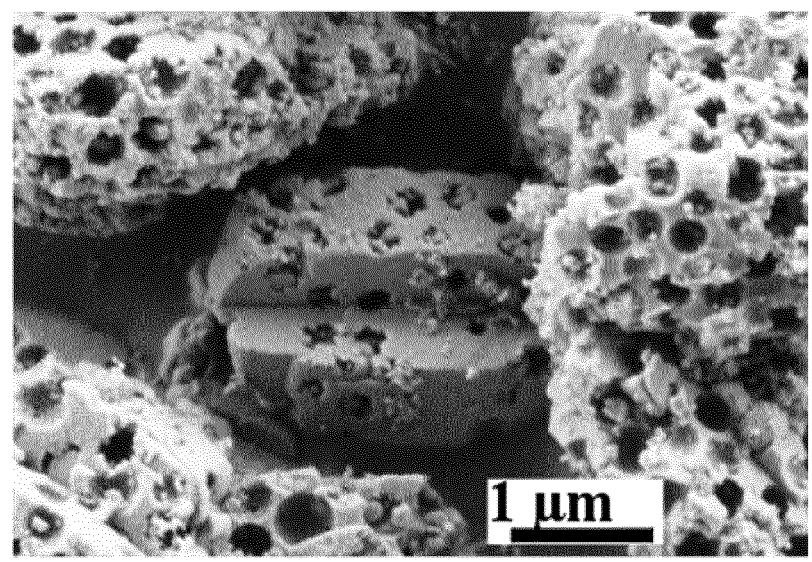
FIG. 11 shows a scanning electron micrograph of the aluminum-containing single crystals of a macroporous MFI-type zeolite according to the present invention.
Figure 12:
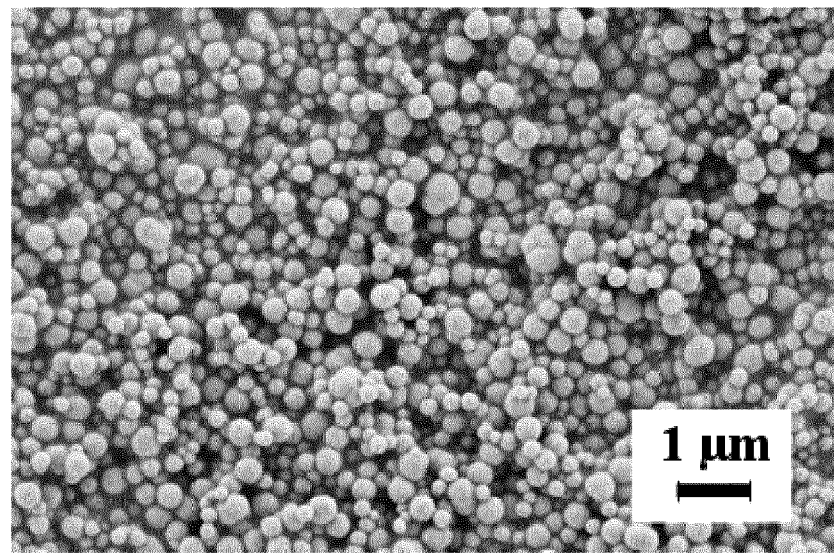
FIG. 12 shows a scanning electron micrograph of the calcined mesoporous silicon dioxide particles of Example 3.
Figure 13:
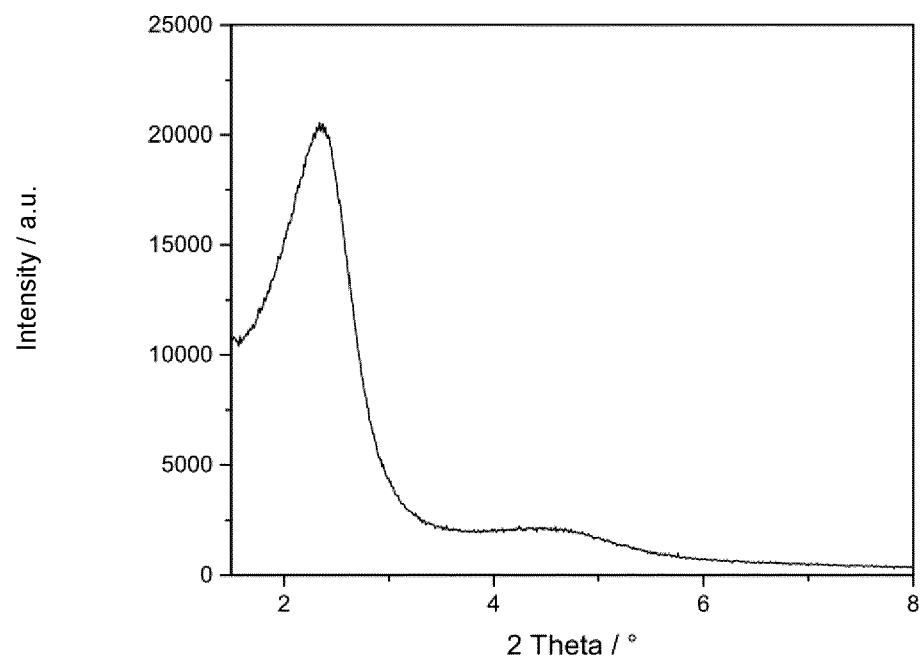
FIG. 13 shows an X-ray diffractogram of the calcined mesoporous silicon dioxide particles of Example 3.
Figure 14:
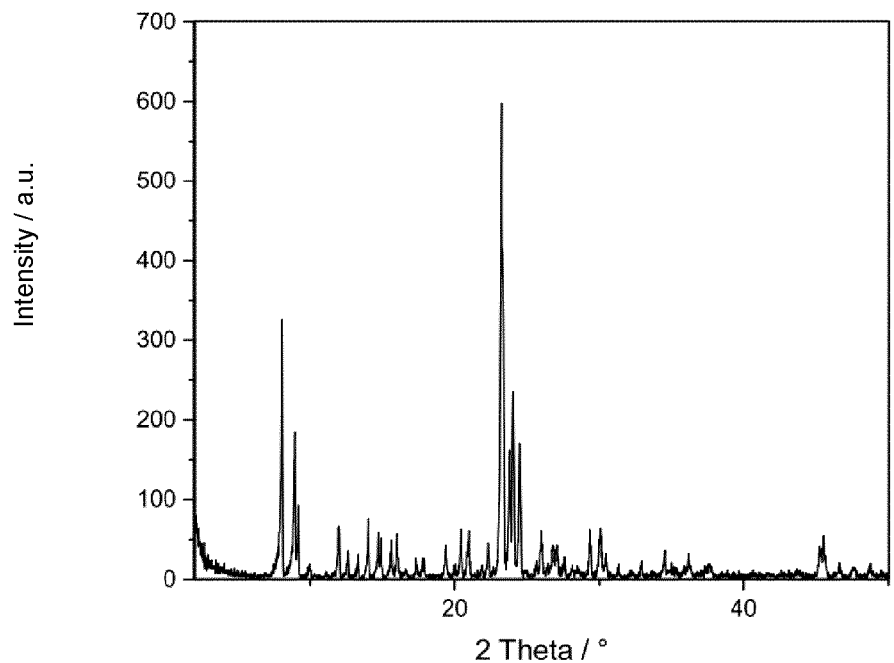
FIG. 14 shows an X-ray diffractogram of the aluminum-containing single crystals of a macroporous MFI-type zeolite with aluminum according to the present invention, prepared according to Example 6.
Figure 15:
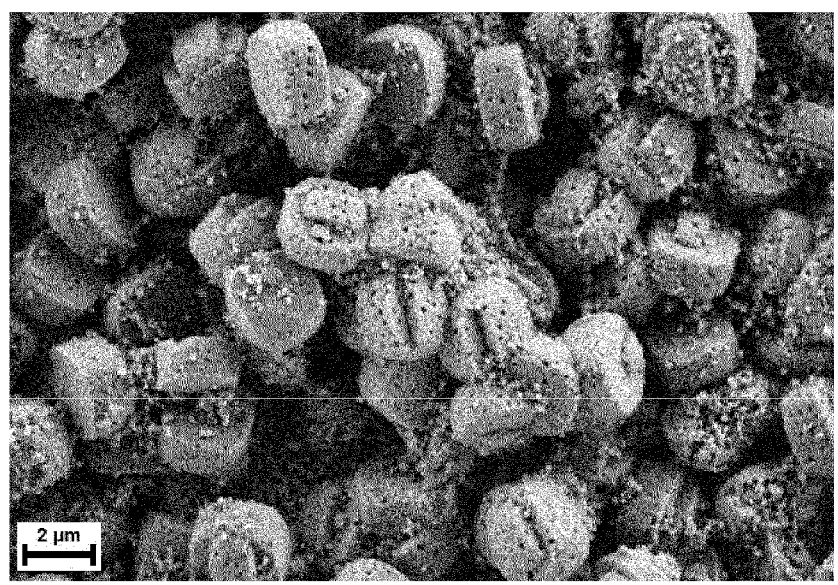
FIG. 15 shows a scanning electron micrograph of the aluminum-containing single crystals of a macroporous MFI-type zeolite with aluminum according to the present invention, prepared according to Example 6.
Figure 16:
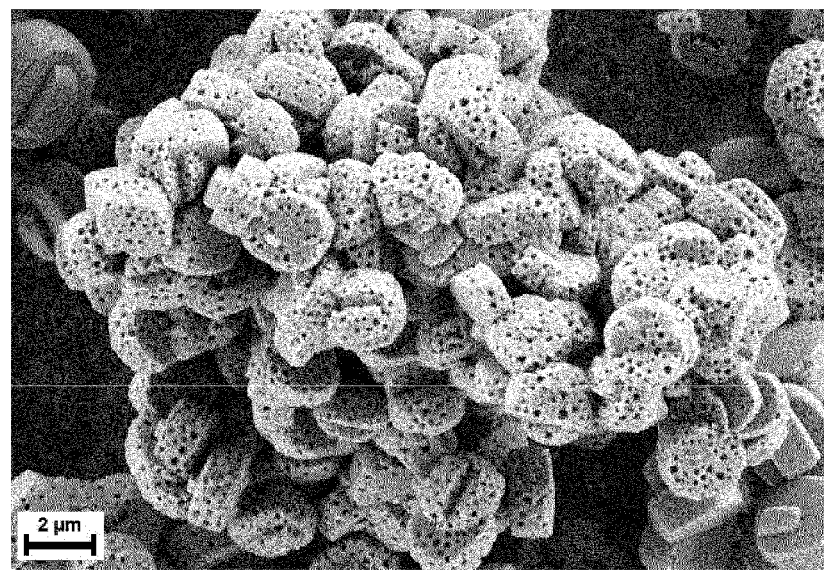
FIG. 16 shows a scanning electron micrograph of the aluminum-containing single crystals of a macroporous MFI-type zeolite with aluminum according to the present invention, prepared according to Example 6 after the alkaline treatment.
Figure 17:
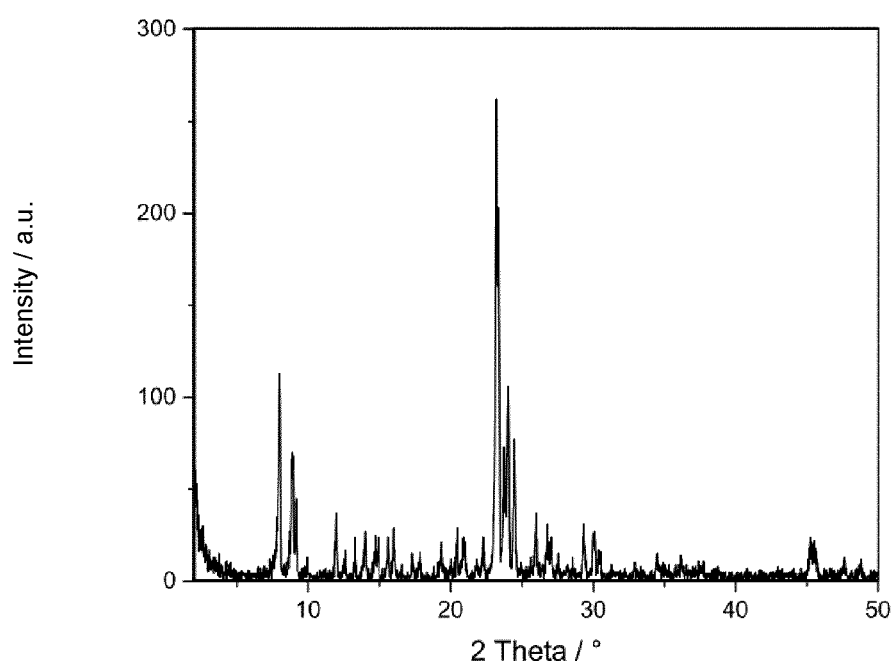
FIG. 17 shows an X-ray diffractogram of the aluminum-containing single crystals of a macroporous MFI-type zeolite with aluminum according to the present invention, prepared according to Example 7.
Figure 18:
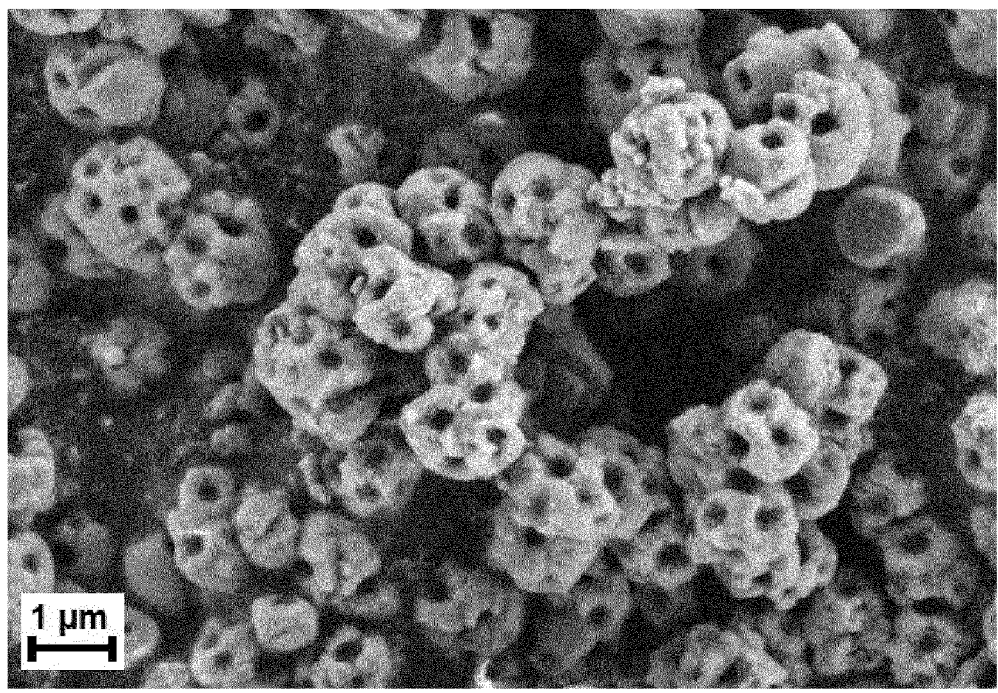
FIG. 18 shows a scanning electron micrograph of the aluminum-containing single crystals of a macroporous MFI-type zeolite with aluminum according to the present invention, prepared according to Example 7.

The invention claimed is:
1. Zeolitic material comprising zeolitic single crystals, characterized in that the single crystals each have an intracrystalline pore system comprising at least one micropore system and at least one macropore system, wherein within each single crystal several macropores are present within a microporous zeolitic framework, and at least one system of interconnected macropores is present which comprises one or more openings to the crystal surface.

2. Zeolitic material according to claim 1, characterized in that the intracrystalline pore system comprises several macropores with a pore diameter of at least 100 nm.

3. Zeolitic material according to claim 1, characterized in that the intracrystalline pore system comprises several macropores open to the crystal surface whose opening diameter is at least 100 nm.

4. Zeolitic material according to claim 1, characterized in that a system of interconnected macropores extends from at least a first crystal surface to at least a second crystal surface and comprises at least one opening to the first and the second crystal surface, respectively.

5. Zeolitic material according to claim 1, characterized in that the microporous zeolitic framework is formed from of tetrahedral $SiO_2$ units, wherein up to 30% of all silicon atoms in the framework can be replaced with one or more elements selected from boron, aluminum, phosphorus and titanium.

6. Method for the production of a zeolitic material according to claim 1, characterized in that the method comprises the following steps:
   a) providing a mixture of (i) porous particles of an oxide capable of forming a framework of a zeolitic material and (ii) an organic template for the zeolite synthesis;
   b) converting the mixture into a zeolitic material by heating the mixture in contact with water vapor, wherein the porous particles are mesoporous particles having a particular size between 50 nm and 2,000 nm.

7. Method according to claim 6, characterized in that providing the mixture in step a) comprises impregnating the porous particles with a solution or a dispersion of the organic template, optionally followed by a partial or complete removal of the solvent of the solution or dispersion.

8. Method according to claim 6, characterized in that in the mixture provided in step a) the organic template is present on the surface and in the pores of the porous particles.

9. Method according to claim 6, characterized in that the porous particles have a particle size between 100 nm and 800 nm.

10. Method according to claim 6, characterized in that the porous particles are $SiO_2$ particles.

11. Method according to claim 6, characterized in that the mixture provided in step a) additionally comprises one or more precursor compounds selected from a precursor compound of an aluminum oxide, a titanium oxide, a phosphorus oxide and a boric oxide, or from combinations of such precursor compounds.

* * * * *